United States Patent [19]

Furutani et al.

[11] Patent Number: 5,708,397
[45] Date of Patent: Jan. 13, 1998

[54] HIGH FREQUENCY CIRCUIT DEVICE WITH STRIPLINE HAVING AN ADJUSTABLE ATTACHMENT POSITION FOR VARACTOR DIODE TERMINAL

[75] Inventors: Nagahisa Furutani, Kawasaki; Tsuneyuki Tanaka, Yamanashi, both of Japan

[73] Assignees: Fujitsu Limited, Kawasaki; Fujitsu Quantum Devices Limied, Yamanashi, both of Japan

[21] Appl. No.: 669,837

[22] Filed: Jun. 26, 1996

Related U.S. Application Data

[63] Continuation of Ser. No. 183,292, Jan. 19, 1994, abandoned.

[30] Foreign Application Priority Data

Jan. 19, 1993 [JP] Japan ................................ 5-006581

[51] Int. Cl.$^6$ .............................. H03B 5/18; H01P 1/185
[52] U.S. Cl. ............................ 331/107 SL; 331/117 V; 331/117 D; 331/96; 333/235; 333/205; 333/164; 333/139
[58] Field of Search ............................ 331/117 D, 107 SL, 331/177 V, 96; 333/164, 139, 24.1, 24.2, 1.1, 205, 219, 235, 156, 161

[56] References Cited

U.S. PATENT DOCUMENTS

| | | | |
|---|---|---|---|
| 3,422,378 | 1/1969 | La Rosa | 333/1.1 |
| 4,195,296 | 3/1980 | Williams | 333/1.1 |
| 4,507,629 | 3/1985 | Frank | 333/1.1 |
| 4,859,972 | 8/1989 | Franke et al. | 333/164 |

FOREIGN PATENT DOCUMENTS

| | | | |
|---|---|---|---|
| 0100507 | 6/1983 | Japan | 331/117 D |
| 002407 | 1/1984 | Japan | 331/117 D |
| 0163701 | 7/1986 | Japan | 333/164 |
| 0292706 | 11/1988 | Japan | 331/117 D |

OTHER PUBLICATIONS

"Electronically–Variable Phase Shifters Utilizing Variable Capacitance Diodes," by Hardin et al., Proc. of I.R.E., May, 1960, pp. 944–945.

Patent Abstracts of Japan, E-780 Jun. 29, 1989, vol. 13/No. 285, Application No. 62-227304, "Variable Phase Shifter".

IEEE Transactions On Microwave Theory and Techniques, vol. MTT–33, No. 7, Jul. 1985, Atwater, Harry A. "Circuit Design of the Loaded–Line Phase Shifter".

Translation of Office Action issued in counterpart German Application, P4401005.2-35, on Mar. 24, 1995.

Primary Examiner—Robert Pascal
Assistant Examiner—Arnold Kinkead
Attorney, Agent, or Firm—Staas & Halsey

[57] ABSTRACT

A high-frequency circuit device includes a varactor diode having a first terminal and a second terminal, a first strip line connected to the first terminal of the varactor diode, a voltage being applied to the varactor diode via the first terminal, a second strip line having a first end connected to the second terminal of the varactor diode, and a second open end. The second strip line has a length so as to obtain an equivalent strip line length taking into capacitances of the varactor diode and the second strip line. The equivalent strip line length determines a characteristic of the high-frequency circuit device.

8 Claims, 7 Drawing Sheets

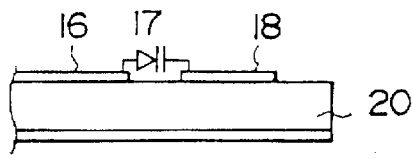
FIG. 5A
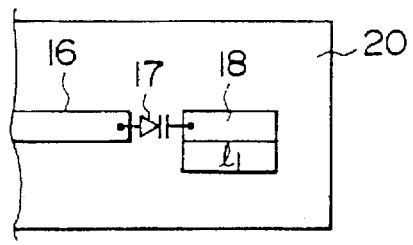
FIG. 5B
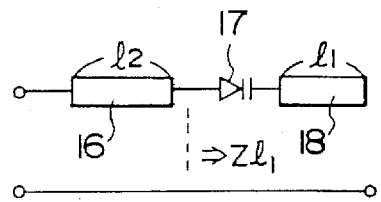
FIG. 5C
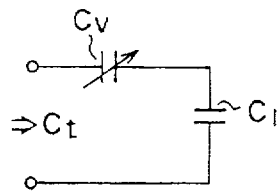
FIG. 5D
FIG. 6
| VOLTAGE APPLIED $V_v$ [V] | PRIOR ART $C_v$ [PF] | 1ST EMBDMT $C_v$ [PF] |
|---|---|---|
| 0.5 | 1.15 | 3.4 |
| 1.0 | 0.98 | 2.9 |
| 2.0 | 0.80 | 2.4 |
| 5.0 | 0.62 | 1.7 |
| 10.0 | 0.46 | 1.2 |
| 20.0 | 0.36 | 0.83 |
| 30.0 | 0.30 | 0.70 |

5,708,397

1

HIGH FREQUENCY CIRCUIT DEVICE WITH STRIPLINE HAVING AN ADJUSTABLE ATTACHMENT POSITION FOR VARACTOR DIODE TERMINAL

This application is a continuation of application Ser. No. 08/183,292, filed Jan. 19, 1994, now abandoned.

BACKGROUND OF THE INVENTION

1. Field of the Invention

The present invention generally relates to high-frequency circuit devices, and more particularly to a microwave integrated circuit (MIC) device.

2. Background of the Invention

An MIC devices includes various structural parts mounted on an MIC base. Such an MIC device is widely used to form a voltage-controlled oscillator, a phase shifter or the like.

Normally, the specification (desired characteristics thereof) of a desired MIC device used for a voltage-controlled oscillator or a phase shifter is determined. Thereafter, structural parts of the desired MIC device are designed to obtain the specification. For example, when a voltage-controlled oscillator is designed, structural parts must be designed to obtain a desired oscillating frequency characteristic. Normally, in the voltage-controlled oscillator, the phase shifter or the like needs electronic parts such as semiconductor elements. Examples of those electronic parts are a transistor and a varactor diode. Of course, such a transistor and a varactor diode must be specifically designed to achieve the desired specification and obtain the desired characteristics. The above holds true for the phase shifter. That is, structural parts of a desired varactor diode phase shifter must be designed to obtain a target amount of phase shift.

SUMMARY OF THE INVENTION

It is an object of the present invention to provide a high-frequency circuit device in which electronic parts, such as semiconductor elements available in the marketplace can be employed instead of specifically designed elements. Use of such marketed semiconductor elements contributes to improvements in the production cost and mass productivity. As is well known, marketed semiconductor devices are not designed to obtain a specific characteristic. Hence, it is impossible to replace the specifically designed semiconductor elements with semiconductor elements available in the market. If such a replacement is performed, the high-frequency (MIC) circuit device will not have the desired characteristics.

More specifically, it is an object of the present invention to provide a high-frequency circuit device having a circuit configuration having means for adjusting its operational characteristics so that target characteristics can be easily obtained by using marketed electronic parts.

The above objects of the present invention are achieved by a high-frequency circuit device comprising: a varactor diode having a first terminal and a second terminal; a first strip line connected to the first terminal of the varactor diode, a voltage being applied to the varactor diode via the first terminal; a second strip line having a first end connected to the second terminal of the varactor diode, and a second open end, the second strip line having a length so as to obtain an equivalent strip line length taking into capacitances of the varactor diode and the second strip line, the equivalent strip line length determining a characteristic of the high-frequency circuit device.

2

BRIEF DESCRIPTION OF THE DRAWINGS

Other objects, features and advantages of the present invention will become more apparent from the following detailed description when read in conjunction with the accompanying drawings, in which:

FIG. 5A is a side view of a part of the voltage-controlled oscillator shown in FIGS. 2 and 4;

FIG. 5B is a plan view of the above part of the voltage-controlled oscillator shown in FIG. 5A;

FIG. 5C is an equivalent circuit diagram of the part shown in FIGS. 5A and 5B;

FIG. 5D is another equivalent circuit diagram of the part shown in FIGS. 5A and 5B taking into account only capacitance components thereof;

FIG. 6 is a diagram showing variations in varactor diodes shown in FIGS. 1 and 3 as a function of voltages applied thereto;

DESCRIPTION OF THE PREFERRED EMBODIMENTS

Figure 1:
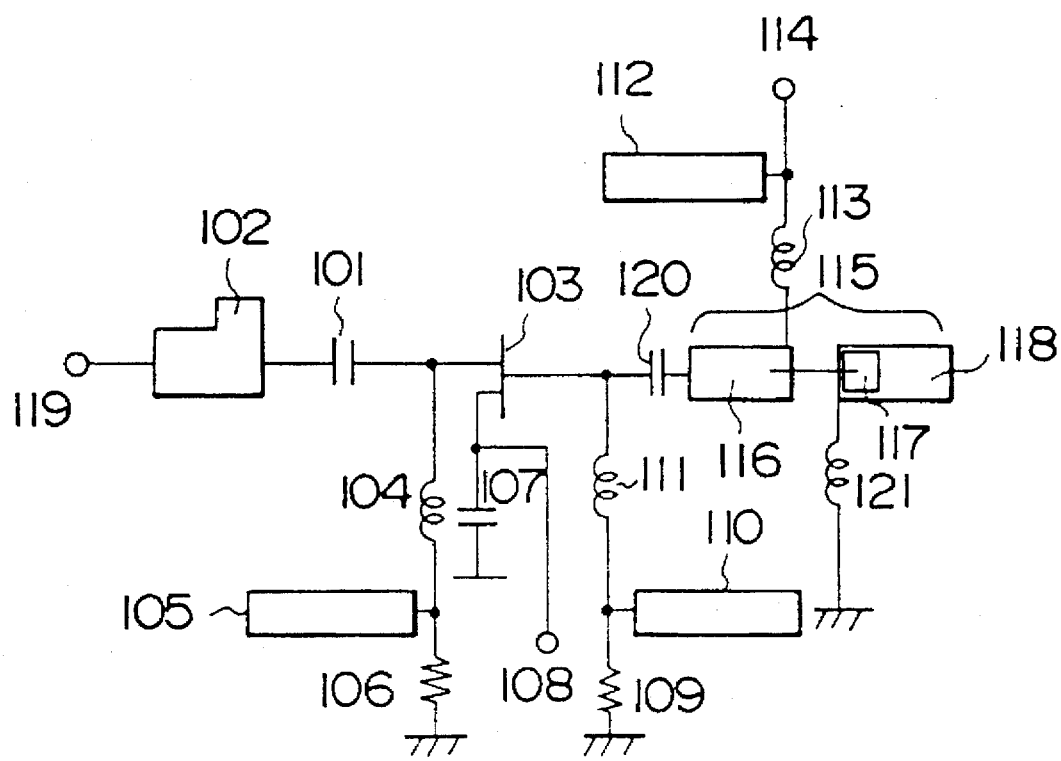
FIG. 1 is a circuit diagram of a conventional high-frequency circuit device functioning as a voltage-controlled oscillator.
Figure 2:
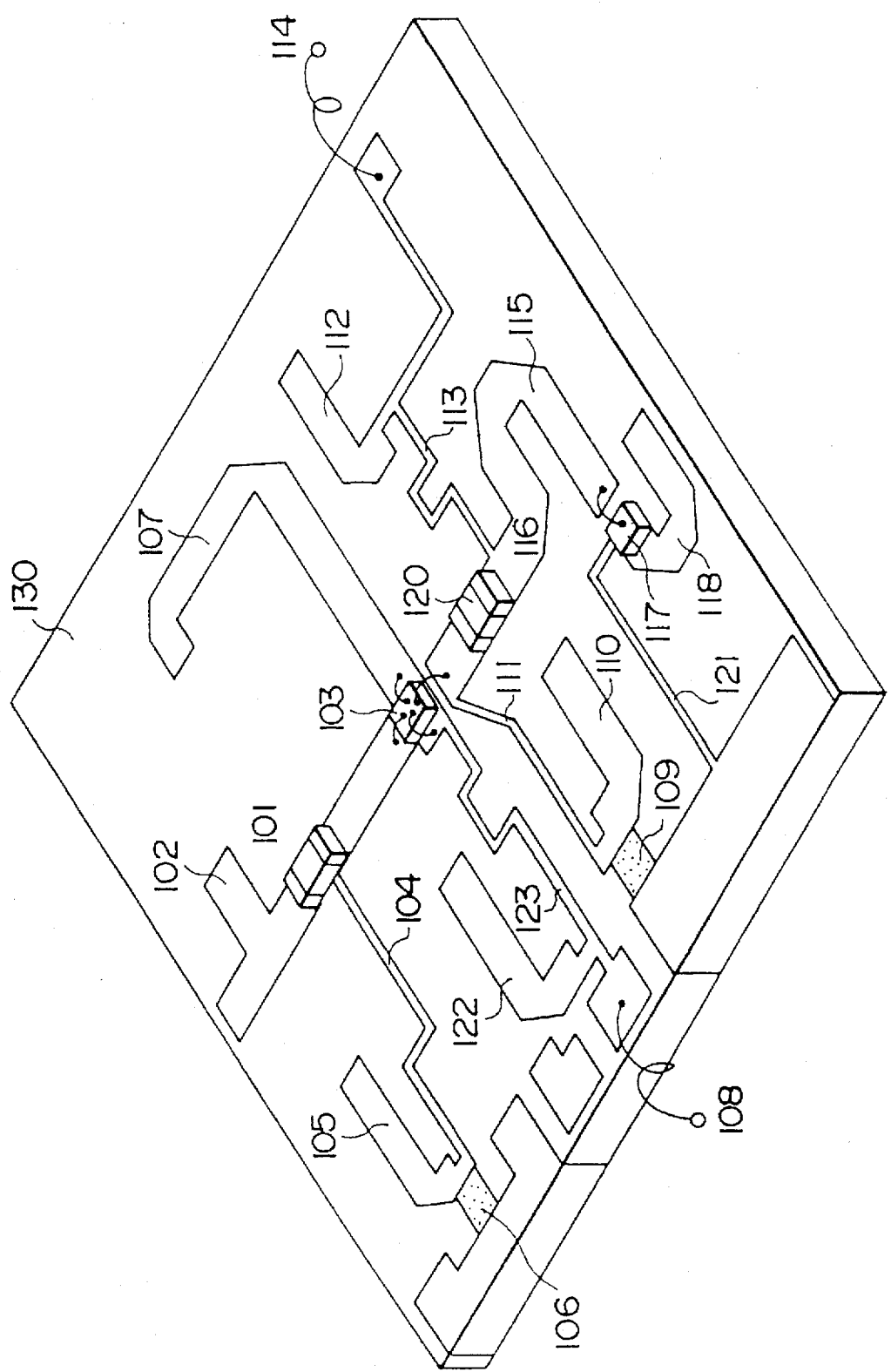
FIG. 2 is a perspective view of the conventional high-frequency circuit device shown in FIG. 1.

FIG. 1 is a circuit diagram of a voltage-controlled oscillator (VCO) device using specifically designed electronic parts, and FIG. 2 is a perspective view of the VCO device shown in FIG. 1. The VCO device shown FIGS. 1 and 2 includes a coupling capacitor 101, an output matching circuit 102, an oscillation transistor chip 103, a λ/4 strip line 104, a strip line 105, a thin-film resistor 106 for biasing, a strip line 107, a bias supply terminal 108, a thin-film resistor 109, a strip line 110, a λ/4 strip line 111, a strip line 112, a λ/4 strip line 113, a bias supply terminal 114, an n λ/4 strip line resonator (n=1, 2, . . . ) 115, an output terminal 119, a coupling capacitor 120, and a λ/4 strip line 121. The strip line resonator 115 is made up of a strip line 116, a varactor diode chip 117, and a strip line 118. The strip lines 105, 107, 110, 112, 122 function as ground at high frequencies in the microwave range. As shown in FIG. 2, the bias supply terminal 108 is connected to one end of the coupling capacitor via a λ/4 strip line 122. The above structural elements are mounted on an MIC base 130.

The varactor diode chip 117 itself is completely mounted on the strip line 118, as shown in FIGS. 1 and 2. Normally, the varactor diode chip is formed on the strip line 118. In the case shown in FIG. 2, the varactor diode chip 117 is attached to the strip line 118 via an electrode formed on the bottom surface of the varactor diode chip 117 by means of an adhesive, and is contacted to the strip line 116 via an electrode formed on the upper surface thereof by wire bonding. The oscillation transistor chip 103 is formed on a strip line, which is not packaged. In the case shown in FIG. 2, terminals are formed on the chip and connected to the corresponding lines by wire bonding.

The oscillation transistor chip 103 and the varactor diode chip 117, which are semiconductor elements, are designed specifically to achieve a desired characteristic of the VCO device. More particularly, the specifications of the oscillation transistor chip 103 and the varactor diode chip 117 are designed to operate on a target oscillating frequency range. The oscillating frequency itself can be adjusted by applying a bias voltage to the bias supply terminal 114.

If the oscillation transistor chip 103 and the varactor diode chip 117 are replaced by those available in the market, the oscillating frequency range obtained with these elements may differ from the target oscillating frequency range except for a case where the marketed elements have characteristics that coincide with those of the specifically designed elements. This problem is serious, particularly if a marketed varactor diode chip, having a characteristic different from the specifically designed varactor diode chip 117, is used.

The above situation holds true for another MIC device, such as a phase shifter including a varactor diode. The amount of phase shift obtained with a varactor diode available in the market may differ from the target amount of phase shift obtained with a specifically designed varactor diode.

Figure 3:
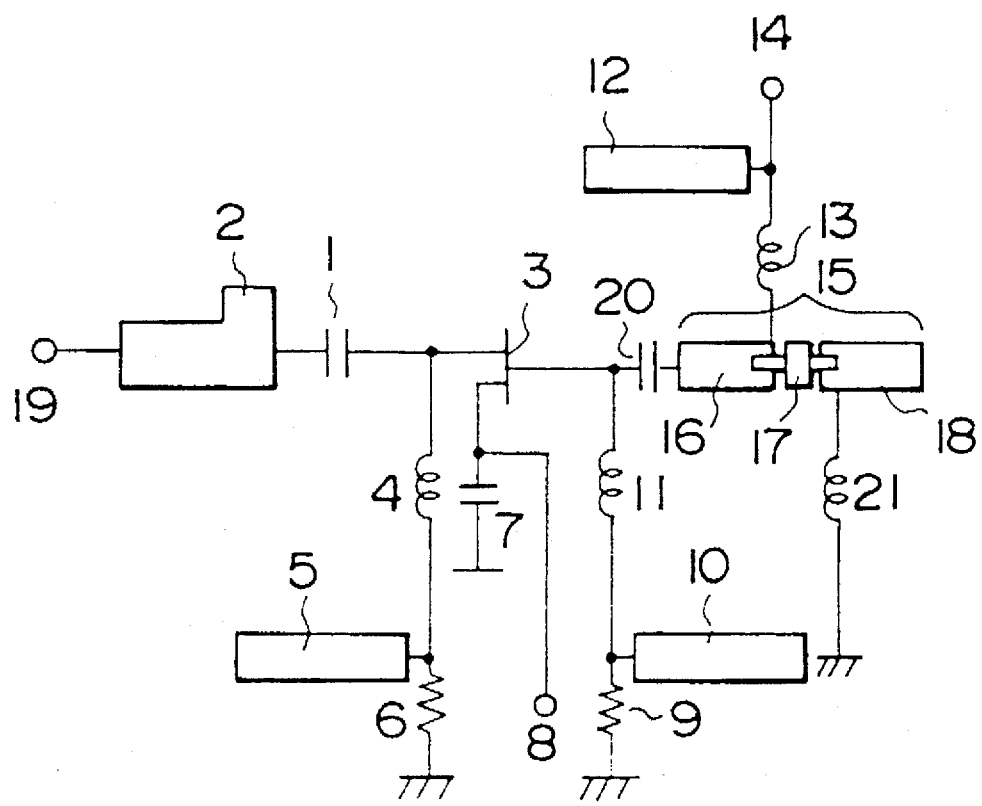
FIG. 3 is a circuit diagram of a voltage-controlled oscillator according to a first embodiment of the present invention.
Figure 4:
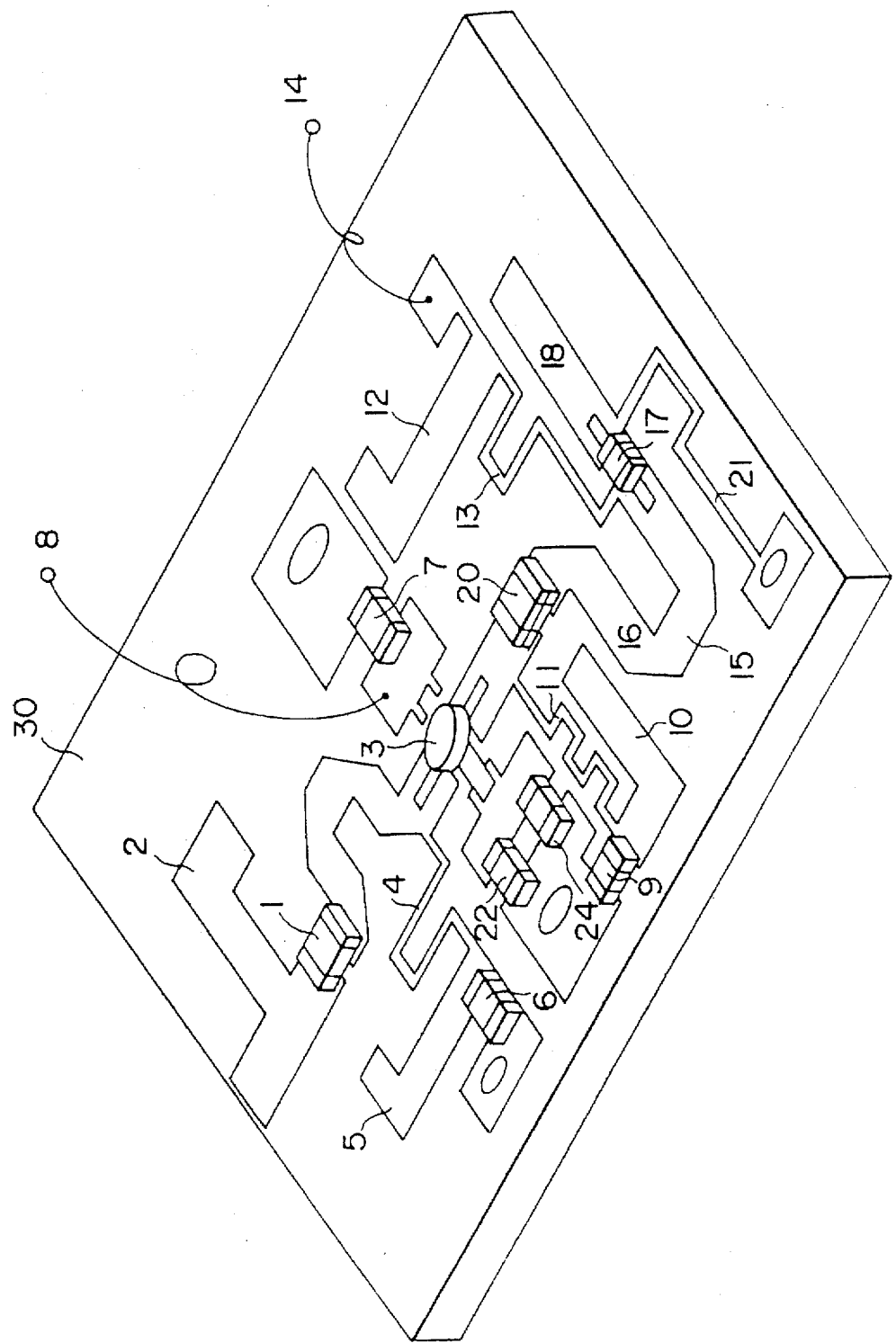
FIG. 4 is a perspective view of the voltage-controlled oscillator shown in FIG. 3.

FIG. 3 is a circuit diagram of a VCO device according to a first embodiment of the present invention, and FIG. 4 is a perspective view of the VCO device shown in FIG. 3. The VCO device shown FIGS. 3 and 4 includes a coupling capacitor 1, an output matching circuit 2, an oscillation transistor element 3, a λ/4 strip line 4, a strip line 5, a chip resistor 6 for biasing, a coupling capacitor 7, a bias supply terminal 8, a chip resistor 9, a strip line 10, a λ/4 strip line 11, a strip line 12, a λ/4 strip line 13, a bias supply terminal 14, an nλ/4 strip line resonator (n=1, 2, . . . ) 15, a coupling capacitor 20, and a λ/4 strip line 21.

The strip line resonator 15 is made up of a strip line 16, a varactor diode 17 and a strip line 18. The strip lines 5, 10 and 12 and the coupling capacitor 7 function as ground at high frequencies in the microwave range. The strip lines 4, 11, 13 and 21 function as RFCs. As shown in FIG. 4, coupling capacitors 22 and 24 (not shown in FIG. 3) are connected to the oscillation transistor element 3, which is formed with, for example, a discrete type GaAs field effect transistor, which is normally packaged. The gate of the FET 3 is coupled to the strip line 6 via the coupling capacitor 20. The drain of the FET 3 is coupled to the output terminal 19 via the coupling capacitor 1 and the output matching circuit 2. The bias voltage is supplied to the source of the FET 3.

The varactor diode 17 is formed with, for example, a discrete type varactor diode, which is normally packaged. The transistor 3 and the varactor diode 17 may be those available in the market and are not specifically designed to obtain a target oscillating frequency range. The terminal pins of the varactor diode 17 are directly attached to the strip lines 16 and 18 by, for example, soldering. The above structural elements are mounted on an MIC substrate 30.

According to the first embodiment of the present invention, the oscillating frequency can be controlled by adjusting not only the bias signals applied to the bias supply terminal 14 but also the attachment position of the varactor diode 17 to the λ/4 strip line 18. The term "attachment position" corresponds to the length of the strip line 18, and the attachment position of the varactor diode 17 is located at the end of the strip line 18 opposite to the open end thereof.

It will be noted that the bias signal applied to the terminal 14 and the position of the varactor diode 17 to the strip line 18 (the length of the strip line 18) vary the resonance frequency of the strip line resonator 15. The adjustment based on the attachment position of the varactor diode 17 to the λ/4 strip line 18 will be described in detail below in conjunction with FIGS. 5A through 5D.

FIG. 5A is a side view of a part of the VCO device shown in FIG. 4, and FIG. 5B is a plan view thereof. Further, FIG. 5C is an equivalent circuit diagram of the strip line resonator 15 including strip lines 16 and 18 and the varactor diode 17, and FIG. 5D is an equivalent circuit diagram thereof taking into account the capacitance components of the strip line resonator 15.

In FIG. 5D, Cv denotes the capacitance of the varactor diode 17, and Cl denotes the capacitance of the strip line 18. The composite capacitance Ct of Cv and Cl can be written as follows:

$$Ct=Cv \cdot Cl/(Cv+Cl)$$

and a variation of the composite capacitance Ct to the capacitance Cv is as follows:

$$\Delta Ct=dCt/dCv=1/(Cv/Cl+1)^2.$$

It can be seen from the above equation that delta Ct is small when Cl is large and is large when Cl is small.

Referring to FIG. 5C, an impedance $Zl_1$ viewing the open end of the strip line 18 from the end of the varactor diode 17 connected to the strip line 18 is written as follows:

$$Zl_1=1/j\omega Cv+Zo/j\omega \tan \beta l_1 = Zo/j \tan \beta l_e$$

where $l_e$ denotes the equivalent length of the resonator 15, $l_1$ is the length between the open end of the strip line 18 and the position in which the terminal of the varactor diode 17 is attached to the strip line 18, and Zo is the characteristic impedance of the strip line 18. From the above equation, the following equation is obtained:

$$l_e = \tan^{-1}\{\omega ZoCv\tan\beta l_1/(\omega ZoCv + \tan\beta l_1)\}$$

$$\beta = 2\pi/\lambda$$

$$= 2\pi f \text{ (}f\text{ is the frequency)}$$

Now, a description will now be given of how the equivalent string line length $l_e$ is varied by changing the capacitance Cv of the varactor diode 17 when the varactor diode attachment position $l_1$ is used as a parameter.

FIG. 6 is a diagram showing variations in the capacitance Cv' of the varactor diode chip 117 shown in FIGS. 1 and 2 and the capacitance Cv of the varactor diode 17 shown in FIGS. 3 and 4 with respect to voltages applied to the varactor diode chip 117 and the discrete varactor diode 17.

Figure 7A:
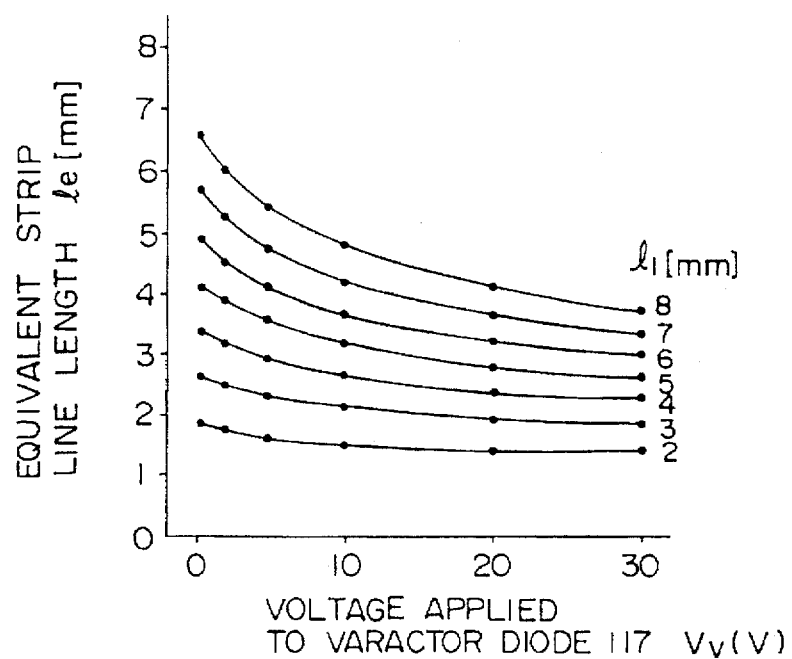
FIGS. 7A and 7B are graphs showing effects of the first embodiment of the present invention.
Figure 7B:
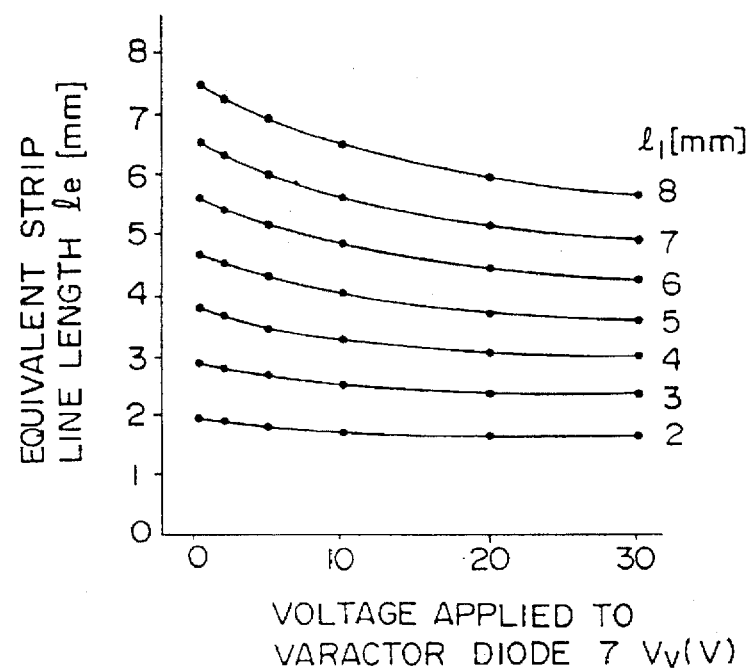

FIG. 7A is a graph showing variations in the equivalent strip line length in the structure shown in FIGS. 1 and 2 as a function of the voltage applied to the varactor diode chip 117 with the strip line length $l_1$ used as a parameter. FIG. 7B is a graph showing variations in the equivalent strip line length in the structure shown in FIGS. 3 and 4 as a function of the voltage applied to the varactor diode 17 with the strip line length $l_1$ used as a parameter. In FIGS. 7A and 7B, the characteristic impedances Zo of the strip lines are equal to 50 [Ω], the frequency f is equal to 9.4 [GHz], and the lengths of the strip lines 118 and 18 is changed as 2, 3, 4, 5, 6, 7 and 8 [mm]. It will be noted that in the structure shown in FIGS. 1 and 2, the length of the strip line 118 may be adjusted for slightly obtaining the target oscillating frequency. However, the length of the strip line 118 is not adjusted in order to change the oscillating frequency range taking into account the capacitance of the varactor diode chip 117.

When the strip line length $l_1$ in the structure shown in FIGS. 1 and 2 is 6 [mm], the same characteristics as those of the structure shown in FIGS. 1 and 2 are obtained by the structure shown in FIGS. 3 and 4 by selecting the length $l_1$ of the strip line 18 within the range between 7–8 [mm]. When the strip line length $l_1$ in the structure shown in FIGS. 1 and 2 is 3 [mm], the same characteristics as those of the structure shown in FIGS. 1 and 2 are obtained by the structure shown in FIGS. 3 and 4 by selecting the length $l_1$ of the strip line 18 within the range between 3–4[mm].

As described above, a target oscillating frequency range can be obtained by selecting the length $l_1$ of the strip line 18 from the open end thereof.

Figure 8:
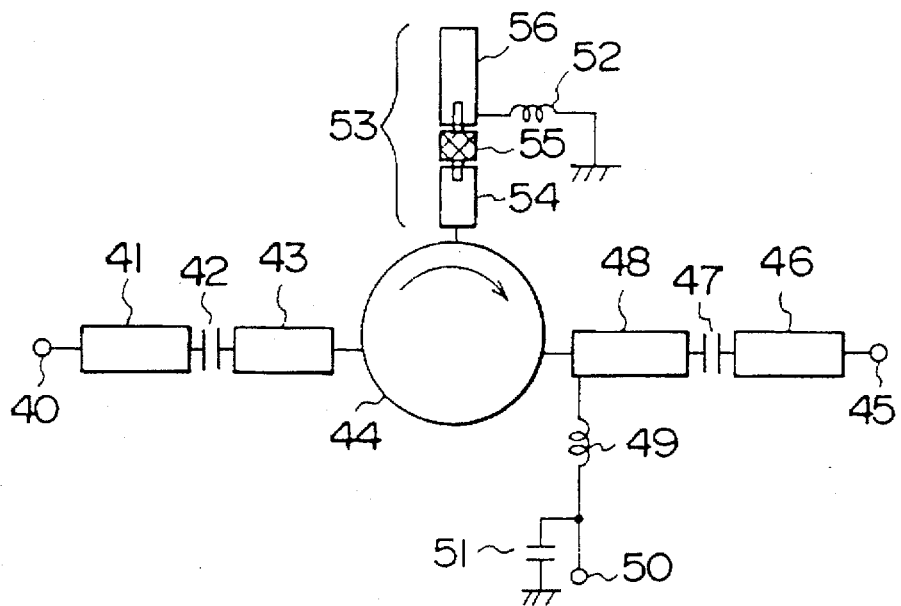
FIG. 8 is a circuit diagram of a phase shifter according to a second embodiment of the present invention.

FIG. 8 is a circuit diagram of a phase shifter according to a second embodiment of the present invention. Originally, the phase shifter shown in FIG. 8 controls the phase of an input signal by a bias signal applied thereto. According to the second embodiment of the present invention, the possible phase shifting range can be adjusted by adjusting the length of a strip line having a first end to which a varactor diode is connected, and a second open end.

More specifically, the phase shifter shown in FIG. 8 is made up of an input terminal 40, a bias supply terminal 50, an output terminal 45, strip lines 41, 43, 46 and 48, coupling capacitors 42 and 47, a ground capacitor 51, RFC coils 49 and 52, a directional coupler 44 formed with a circulator, strip lines 54 and 56, and a varactor diode 55 connected between the strip lines 54 and 56. The circulator 44 has a first terminal connected to the strip line 43, a second terminal connected to the strip line 54, and a third terminal connected to the strip line 48.

The strip lines 54 and 56 and the varactor diode 55 form a strip line resonator 53. This strip line resonator 53 is configured in the same manner as the strip line resonator 15 shown in FIG. 3. By adjusting the length of the strip line 56 from its open end, it is possible to obtain a target phase shifting range, which is achieved by the structure with the specifically designed varactor diode.

Figure 9:
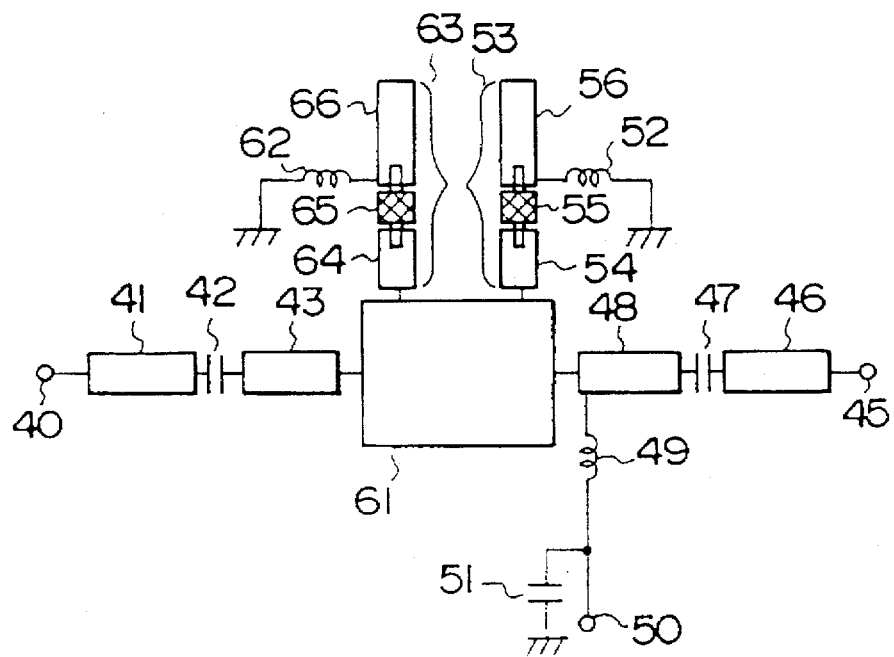
FIG. 9 is a circuit diagram of a phase shifter according to a third embodiment of the present invention.

FIG. 9 is a circuit diagram of a phase shifter according to a third embodiment of the present invention. Originally, the phase shifter shown in FIG. 8 controls the phase of an input signal by a bias signal applied thereto. According to the third embodiment of the present invention, the possible phase shifting range can be adjusted by adjusting the lengths of strip lines respectively having first ends to which varactor diodes are connected, and second open ends. In FIG. 9, parts that are the same as those shown in FIG. 8 are given the same reference numbers as previously.

More particularly, the phase shifter shown in FIG. 9 includes a directional coupler 61 formed with a 90° hybrid device instead of the circulator 44 shown in FIG. 8. In addition to the strip line resonator 53 shown in FIG. 8, a strip line resonator 63 is connected to the directional coupler 61. The strip line resonator 63 includes two strip lines 64 and 66, and a varactor diode 65 connected therebetween. An RFC coil 62 is connected to the strip line 66. That is, the hybrid device 61 has a first terminal coupled to the strip line 43, a second terminal coupled to the resonator 63, a third terminal coupled to the resonator 53, and a fourth terminal coupled to the strip line 48.

By adjusting the lengths of the strip lines 56 and 66 from their open ends, it is possible to obtain a target phase shifting range which is achieved by the structure with the specifically designed varactor diodes.

According to the present invention, the equivalent strip line length of the resonator taking into account the capacitance of the varactor diode can be controlled.

The present invention is not limited to the specifically disclosed embodiments, and variations and modifications may be made without departing from the scope of the present invention.

What is claimed is:

1. A high-frequency circuit device, comprising:

a varactor diode having a first terminal and a second terminal;

a first strip line connected to the first terminal of said varactor diode, a voltage being applied to the varactor diode via the first terminal; and a second strip line having a first end connected to the second terminal of said varactor diode, and a second open end, said second strip line having an adjustable effective length adjusted by varying an attachment position of a connection of said varactor diode to said second strip line which results in a desired characteristic of the high frequency circuit device based on a capacitance of said varactor diode and a capacitance of said second strip line.

2. The high-frequency circuit device as claimed in claim 1, wherein said varactor diode is a discrete varactor diode.

3. The high-frequency circuit device as claimed in claim 1, further comprising:

a field effect transistor having a gate coupled to said first strip line, a first terminal receiving a bias voltage, and a second terminal via which an output signal is output, the varactor diode, the first and second strip lines and the field effect transistor forming a voltage-controlled oscillator.

4. The high-frequency circuit device as claimed in claim 1, further comprising:

a directional coupler having a first terminal receiving an input signal, a second terminal connected to the first strip line, and a third terminal coupled to an output terminal, the varactor diode, the first and second strip lines and the directional coupler forming a phase shifter.

5. The high-frequency circuit device as claimed in claim 4, further comprising:

a second varactor diode having a first terminal and a second terminal;

a third strip line connected to the first terminal of said second varactor diode, a voltage being applied to the varactor diode via the first terminal of said second varactor diode;

a fourth strip line having a first end connected to the second terminal of said second varactor diode, and a second open end, the fourth strip line having a length so as to obtain an equivalent strip line length taking into account capacitances of said second varactor diode and said fourth strip line, said equivalent strip line length determining a characteristic of the high-frequency circuit device, wherein said directional coupler has a fourth terminal coupled to the third strip line.

6. A high-frequency circuit device comprising:

a varactor diode having a first terminal and a second terminal;

a first strip line connected to the first terminal of said varactor diode, a voltage being applied to the varactor diode via the first terminal; and a second strip line having a first end connected to the second terminal of said varactor diode, and a second open end, the second strip line being adjustable in length to change a desired characteristic of the high frequency circuit device.

7. A high-frequency circuit device as set forth in claim 6, wherein the length of the second strip line is adjusted by varying the attachment position of said varactor diode on said second strip line.

8. A high-frequency circuit device comprising:

a varactor diode having a first terminal and a second terminal;

a first strip line connected to the first terminal of said varactor diode, a voltage being applied to the varactor diode via the first terminal; and a second strip line having a first end connected to the second terminal of said varactor diode, and a second open end, said second strip line being adjustable in length and having an equivalent strip line length responsive to a voltage applied to said varactor diode and the strip line length.

* * * * *

UNITED STATES PATENT AND TRADEMARK OFFICE
CERTIFICATE OF CORRECTION

PATENT NO. : 5,708,397
DATED : Jan. 13, 1998
INVENTOR(S) : FURUTANI et al.

It is certified that error appears in the above-identified patent and that said Letters Patent is hereby corrected as shown below:

TITLE PAGE:

[75] Inventors: Change "Yamanashi" to --Nakakoma--;

[73] Assignees: Change "Limied, Yamanashi" to --Limited, Nakakoma--.

Signed and Sealed this

Third Day of November, 1998

Attest:

Attesting Officer

BRUCE LEHMAN
Commissioner of Patents and Trademarks